United States Patent
Li et al.

(10) Patent No.: US 11,632,230 B2
(45) Date of Patent: Apr. 18, 2023

(54) LOW POWER DIGITAL-TO-TIME CONVERTER (DTC) LINEARIZATION

(71) Applicant: QUALCOMM Incorporated, San Diego, CA (US)

(72) Inventors: Alvin Siu-Chi Li, San Diego, CA (US); Tomas O'Sullivan, San Diego, CA (US); Jianjun Yu, San Diego, CA (US); Yiwu Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 32 days.

(21) Appl. No.: 17/340,953

(22) Filed: Jun. 7, 2021

(65) Prior Publication Data
US 2022/0393565 A1  Dec. 8, 2022

(51) Int. Cl.
| | | |
|---|---|---|
| H04L 7/033 | (2006.01) | |
| H03L 7/08 | (2006.01) | |
| H03L 7/085 | (2006.01) | |
| H03K 5/131 | (2014.01) | |

(52) U.S. Cl.
CPC ............ *H04L 7/033* (2013.01); *H03K 5/131* (2013.01); *H03L 7/08* (2013.01); *H03L 7/085* (2013.01)

(58) Field of Classification Search
CPC .................................. H03K 5/131; H03L 7/085
See application file for complete search history.

(56) References Cited

U.S. PATENT DOCUMENTS

| | | | | | |
|---|---|---|---|---|---|
| 4,539,551 | A | * | 9/1985 | Fujita | H03K 5/249 341/158 |
| 4,754,216 | A | * | 6/1988 | Wong | G01R 29/18 331/25 |
| 4,931,998 | A | * | 6/1990 | Ootani | G11C 8/18 365/230.01 |
| 4,973,978 | A | * | 11/1990 | Jordan | H03M 1/0619 327/261 |
| 5,682,113 | A | * | 10/1997 | Park | H03K 5/04 327/261 |
| 8,497,716 | B2 | * | 7/2013 | Zhang | H03L 7/1976 327/147 |
| 10,050,634 | B1 | * | 8/2018 | Zhao | H03L 7/091 |
| 10,567,154 | B1 | * | 2/2020 | Wentzloff | H03L 7/0995 |

(Continued)

FOREIGN PATENT DOCUMENTS

CN           104901699 B      12/2017

OTHER PUBLICATIONS

International Search Report and Written Opinion—PCT/US2022/029655—ISA/EPO—dated Sep. 1, 2022.
(Continued)

*Primary Examiner* — Adam D Houston
(74) *Attorney, Agent, or Firm* — Loza & Loza LLP

(57) ABSTRACT

An aspect relates to an apparatus including an input buffer including an input configured to receive an input voltage; a ramp voltage generator including an input coupled to an output of the input buffer; an evaluation circuit including an input coupled to an output of the ramp voltage generator, wherein the evaluation circuit includes a first resistor coupled in series with first field effect transistor (FET) between a first voltage rail and a second voltage rail; and an output buffer including an input coupled to a drain of the first FET and an output configured to generate an output voltage.

30 Claims, 7 Drawing Sheets

(56) References Cited

U.S. PATENT DOCUMENTS

| | | | | |
|---|---|---|---|---|
| 10,581,418 B2* | 3/2020 | Wu | ......................... | H03L 7/0992 |
| 10,594,329 B1* | 3/2020 | Elkholy | .................. | H03L 7/093 |
| 10,606,217 B2* | 3/2020 | Kim | ....................... | H03L 7/1974 |
| 10,895,850 B1* | 1/2021 | Elkholy | ................ | G04F 10/005 |
| 10,965,297 B1* | 3/2021 | Wu | ......................... | H03L 7/0805 |
| 11,018,688 B1* | 5/2021 | Guo | ......................... | H03L 7/193 |
| 11,387,833 B1* | 7/2022 | Li | ............................ | H03L 7/081 |
| 2006/0097764 A1* | 5/2006 | Yeh | ......................... | H03K 5/12 |
| | | | | 327/170 |
| 2015/0280842 A1* | 10/2015 | Mayer | ................... | H03L 7/1976 |
| | | | | 375/316 |
| 2017/0205772 A1* | 7/2017 | Burg | ..................... | G04F 10/005 |
| 2017/0346493 A1* | 11/2017 | Markulic | .............. | H03L 7/0991 |
| 2017/0366376 A1* | 12/2017 | Wang | ................... | H04L 27/2017 |
| 2018/0269895 A1* | 9/2018 | Kim | ...................... | G04F 10/005 |
| 2022/0014208 A1* | 1/2022 | Choi | .................... | H03M 3/322 |
| 2022/0131561 A1* | 4/2022 | Hsu | ..................... | G06F 13/4072 |
| 2022/0182064 A1* | 6/2022 | Li | ........................... | H03L 7/197 |

OTHER PUBLICATIONS

Wu W., et al., "A 28-nm 75-fsrms Analog Fractional-N Sampling PLL with a Highly Linear DTC Incorporating Background DTC Gain Calibration and Reference Clock Duty Cycle Correction," IEEE Journal of Solid-State Circuits, USA, May 2019, vol. 54, No. 5, pp. 1254-1265, XP011721041, ISSN: 0018-9200, DOI:10.1109/JSSC.2019.2899726.

* cited by examiner

US 11,632,230 B2

LOW POWER DIGITAL-TO-TIME CONVERTER (DTC) LINEARIZATION

FIELD

Aspects of the present disclosure relate generally to wireless communication devices, and in particular, to a low power and linearized digital-to-time converter (DTC).

BACKGROUND

A phase locked loop (PLL) is sometimes used to generate a reference signal that may be used by a local oscillator (LO) to generate an LO signal. The LO signal is sometimes applied to a mixer to frequency up-convert a first signal (e.g., a baseband or intermediate frequency (IF) signal, respectively) into a second signal (e.g., an intermediate frequency (IF) signal or a radio frequency (RF) signal, respectively). Similarly, the LO signal is sometimes applied to a mixer to frequency down-convert a first signal (e.g., an RF or IF signal, respectively) into a second signal (e.g., an IF signal or RF signal). The reference signal from the PLL should have minimal noise so that the noise does not propagate to the resulting signals from the mixer.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes an input buffer including an input configured to receive an input voltage; a ramp voltage generator including an input coupled to an output of the input buffer; an evaluation circuit including an input coupled to an output of the ramp voltage generator, wherein the evaluation circuit includes a first resistor coupled in series with a first field effect transistor (FET) between a first voltage rail and a second voltage rail; and an output buffer including an input coupled to a drain of the first FET and an output configured to generate an output voltage.

Another aspect of the disclosure relates to a method. The method includes generating a ramp voltage in response to a first edge of an input voltage that varies with a digital-to-time (DTC) code in accordance with a first transfer function; and generating a second edge of an output voltage that varies with the ramp voltage in accordance with a second transfer function, wherein the second transfer function is substantially inverse of the first transfer function.

Another aspect of the disclosure relates to an apparatus. The apparatus includes means for generating a ramp voltage in response to a first edge of an input voltage that varies with a digital-to-time (DTC) code in accordance with a first transfer function; and means for generating a second edge of an output voltage that varies with the ramp voltage with a second transfer function, wherein the second transfer function is substantially inverse of the first transfer function.

Another aspect of the disclosure relates to a wireless communication device. The wireless communication device includes a phase locked loop (PLL) configured to generate a PLL signal, wherein the PLL includes a digital-to-time converter (DTC) including: an input buffer configured to receive an input voltage; a ramp voltage generator coupled to the input buffer; an evaluation circuit coupled to the ramp voltage generator, wherein the evaluation circuit includes a first resistor coupled in series with first field effect transistor (FET) between a first voltage rail and a second voltage rail; and an output buffer coupled to a drain of the first FET configured to provide an output voltage; a local oscillator (LO) configured to generate an LO signal based on the PLL signal; and a mixer configured to generate a baseband signal, intermediate frequency signal, or radio frequency signal based on the LO signal.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
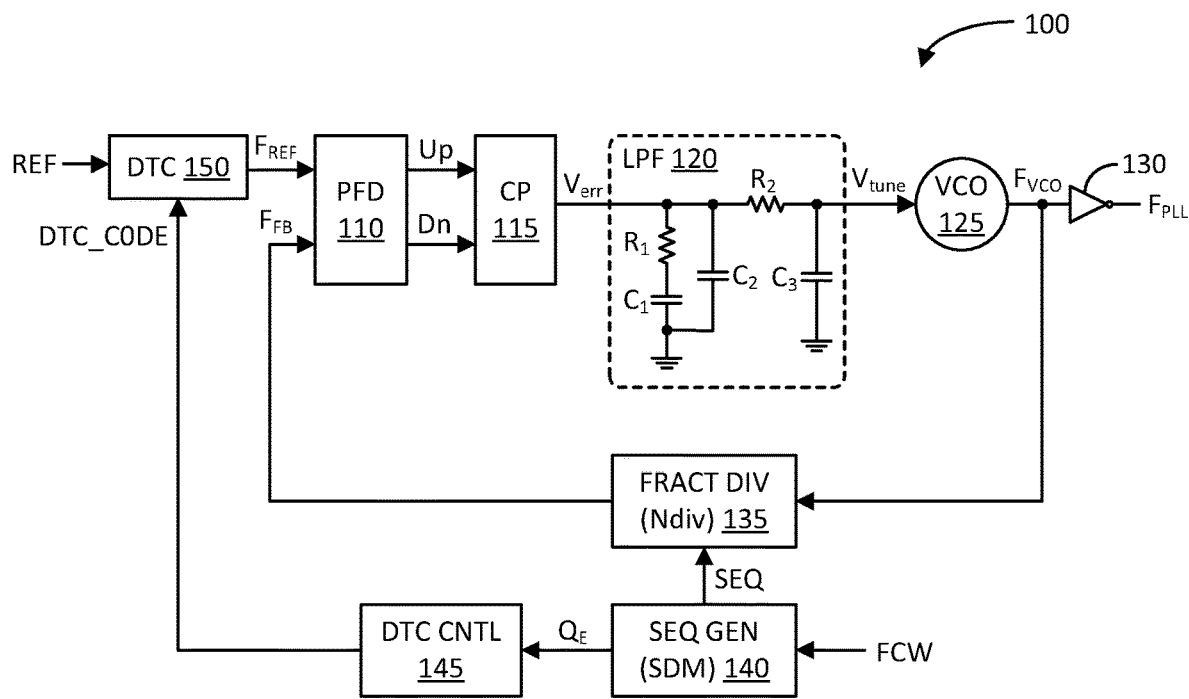
FIG. 1 illustrates a block/schematic diagram of an example phase locked loop (PLL) in accordance with an aspect of the disclosure.

FIG. 1 illustrates a block/schematic diagram of an example phase locked loop (PLL) 100 in accordance with an aspect of the disclosure. The PLL 100 includes a phase-frequency detector (PFD) 110, a charge pump (CP) 115, a low pass filter (LPF) 120 (sometimes referred to as a "loop filter"), a voltage controlled oscillator (VCO) 125, a buffer 130 (which may be configured as one or more cascaded inverters), a fractional frequency divider 135, a sequence generator 140 (sometimes configured as a sigma-delta modulator (SDM)), a digital-to-time converter (DTC) control circuit 145, and a digital-to-time converter (DTC) 150.

The DTC 150 is configured to receive an input reference clock signal (REF), and apply quantization noise $Q_E$ in accordance with a digital-to-time converter (DTC) code (DTC_CODE), to generate an output reference clock signal $F_{REF}$. The DTC 150 includes an output, at which the output reference clock signal $F_{REF}$ is generated, coupled to a first input of the PFD 110. The PFD 110 includes a second input configured to receive a feedback clock signal $F_{FB}$ from the fractional divider 135. Accordingly, the second input of the PFD 110 is coupled to an output, at which the feedback clock signal $F_{FB}$ is generated, of the fractional divider 135. The PFD 110 includes a first output configured to generate an Up signal, and a second output configured to generate a down (Dn) signal.

The charge pump (CP) 115 includes a first input coupled to the first output of the PFD 110. Accordingly, the first input of the charge pump (CP) 115 is configured to receive the Up signal. Similarly, the charge pump (CP) 115 includes a second input coupled to the second output of the PFD 110. Accordingly, the second input of the charge pump (CP) 115 is configured to receive the Dn signal. The charge pump (CP) 115 is configured to charge and discharge an internal capacitor based on the Up and Dn signals to generate a voltage $V_{err}$ related to a phase-frequency error between the output reference clock signal $F_{REF}$ and the feedback clock signal $F_{FB}$. The voltage $V_{err}$ is generated at an output of the charge pump (CP) 115.

The LPF or loop filter 120 is configured to generate a VCO tune voltage $V_{tune}$ at an output based on the error voltage $V_{err}$ received at an input. The LPF or loop filter 120, in turn, includes a first resistor $R_1$ coupled in series with a first capacitor $C_1$ between the input of the filter 120 and ground (e.g., or some reference potential configured to serve as a ground relative to the operating voltages of the circuit); the input of the filter 120 being coupled to the output of the charge pump (CP) 115. The LPF or loop filter 120 further includes a second capacitor $C_2$ coupled between the input of the LPF or loop filter 120 and ground. Additionally, the LPF or loop filter 120 includes a second resistor $R_2$ coupled between the input and the output of the LPF or loop filter 120. Additionally, the LPF or loop filter 120 includes a third capacitor $C_3$ coupled between the output of the LPF or loop filter 120 and ground. It shall be understood that the LPF or loop filter 120 may vary significantly depending on requirements.

The VCO 125 is configured to generate a VCO clock signal $F_{VCO}$ based on the VCO tune voltage $V_{tune}$. Accordingly, the VCO 125 includes a frequency control input coupled to the output of the LPF or Loop filter 120. The VCO 125 includes an output configured to produce the VCO clock signal $F_{VCO}$. The buffer 130, which may be configured as an inverter, includes an input coupled to the output of the VCO 125, and an output configured to produce a PLL clock signal $F_{PLL}$.

The fractional divider (Ndiv) 135 includes an input coupled to the output of the VCO 125. The fractional divider 135 is configured to frequency divide the VCO clock signal $F_{VCO}$ to generate the feedback clock signal $F_{FB}$ based on a sequence (SEQ) generated by a sequence generator 140, such as a sigma-delta modulator. Accordingly, the sequence generator or SDM 140 includes an output coupled to a divider control input of the fractional divider 135. The sequence generator or SDM 140 is configured to generate the sequence (SEQ) based on a frequency control word (FCW) received at an input. That is, for a given clock period of the VCO clock signal $F_{VCO}$, the fractional divider 135 can divide the frequency of the VCO clock signal $F_{VCO}$ by an integer (e.g., 6 or 7). To achieve a fractional division, the fractional divider 135 has to toggle between integers to achieve an effective fractional division based on the mean value of the sequence (SEQ) generated by the sequence generator 140. As an example, if the FCW specifies that the VCO clock signal $F_{VCO}$ is to be 6.5 times the frequency of the reference signal REF, the sequence (SEQ) generated by the sequence generator or SDM 140 has a mean value of 6.5, such as by alternating between a set of integers 6 and 7 or a set of integers 4-8, or another set of different integers where the mean value is 6.5.

To achieve a fractional division as discussed, the fractional divider 135 has to change the divider ratio Ndiv (e.g., Ndiv=$F_{VCO}/F_{REF}$) between a set of values to achieve the effective frequency ratio Ndiv. Thus, the feedback signal $F_{FB}$ includes a set of edges that are not timewise in the same location if the divider ratio Ndiv was an integer. Because of the moving edges, the feedback clock signal $F_{FB}$ has quantization noise $Q_E$, which manifest itself in the frequency domain as high frequency components above the frequency of the feedback clock signal $F_{FB}$. The DTC circuitry, including the DTC control circuit 145 and the DTC 150, are configured to reduce the quantization noise $Q_E$. If the quantization noise $Q_E$ is reduced, the bandwidth of the LPF or loop filter 120 may be widened. This would have the advantage of reducing the integrated phase noise (IPN) and also allowing the PLL 100 to settle faster, which is useful in fast frequency hopping (FFH) applications. An additional benefit resulting from reducing the quantization noise $Q_E$ is that the spot phase noise of the PLL output signal $F_{PLL}$ is improved.

The reduction in the quantization noise $Q_E$ operates as follows: The sequence generator or SDM 140 provides the quantization noise $Q_E$ to the DTC control circuit 145. The quantization noise $Q_E$ may be based on a difference between the current value of the sequence (SEQ) and the FCW. The DTC control circuit 145 generates the DTC_CODE based on the quantization error $Q_E$. Thus, the DTC 150 alters the edges of the input reference clock signal REF based on the quantization error $Q_E$ via the DTC_CODE such that the edges of the output reference clock signal $F_{REF}$ are substantially the same as the edges of the feedback clock signal $F_{FB}$. Thus, the output reference clock signal $F_{REF}$ has substantially the same quantization noise $Q_E$ as the feedback clock signal $F_{FB}$. Accordingly, the PFD 110 substantially cancels out the quantization noise $Q_E$ through its Up/Dn signal control of the charge pump (CP) 115 to generate the error voltage $V_{err}$.

Figure 2:
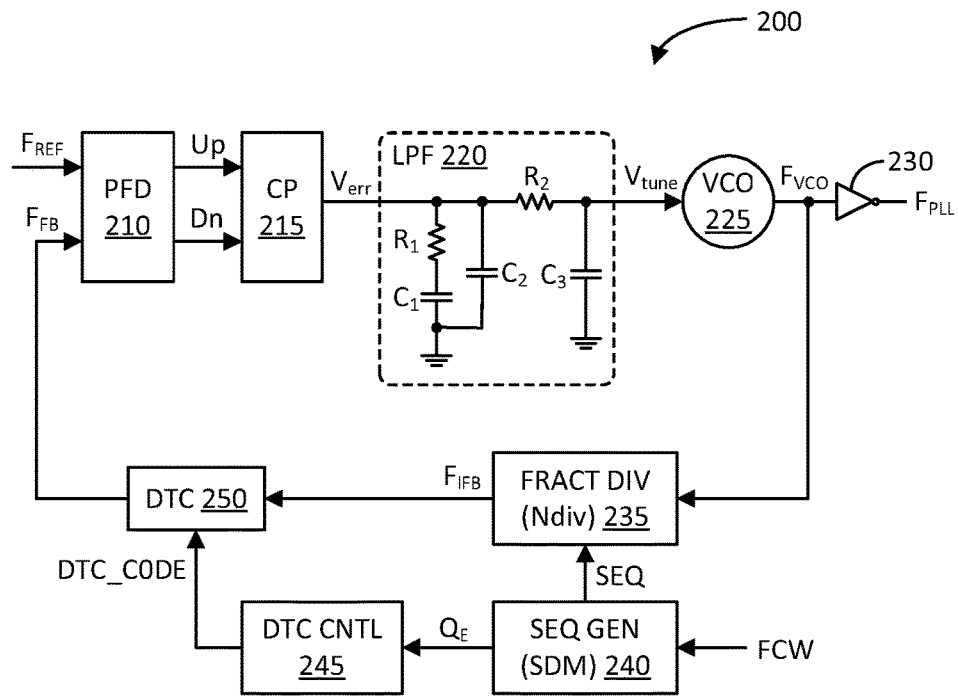
FIG. 2 illustrates a block/schematic diagram of another example phase locked loop (PLL) in accordance with another aspect of the disclosure.

FIG. 2 illustrates a block diagram of another example phase lock loop (PLL) 200 in accordance with another aspect of the disclosure. The PLL 200 includes a phase-frequency detector (PFD) 210, a charge pump (CP) 215, a low pass filter (LPF) 220 (sometimes referred to as a "loop filter"), a voltage controlled oscillator (VCO) 225, a buffer 230 (which may be configured as one or more cascaded inverters), a fractional frequency divider 235, a sequence generator or SDM 240, a DTC control circuit 245, and a digital-to-time converter (DTC) 250.

In this example, the PFD 210 includes a first input configured to receive a reference clock signal $F_{REF}$, a second input configured to receive a feedback clock signal $F_{FB}$ from the DTC 250, a first output configured to generate an Up signal, and a second output configured to generate a down (Dn) signal. The charge pump (CP) 215 includes a first input coupled to the first output of the PFD 210. Accordingly, the first input of the charge pump (CP) 215 is configured to receive the Up signal. Similarly, the charge pump (CP) 215 includes a second input coupled to the second output of the PFD 210. Accordingly, the second input of the charge pump (CP) 215 is configured to receive the Dn signal. The charge pump (CP) 215 is configured to charge and discharge an internal capacitor based on the Up and Dn signals to generate a voltage $V_{err}$ related to a phase-frequency error between the reference clock signal $F_{REF}$ and the feedback clock signal $F_{FB}$. The voltage $V_{err}$ is generated at an output of the charge pump (CP) 215.

The LPF or loop filter 220 is configured to generate a VCO tune voltage $V_{tune}$ at an output based on the error voltage $V_{err}$ received at an input. The LPF or loop filter 220 may be similar to LPF or loop filter 120 previously discussed with resistors $R_1$-$R_2$ and capacitors $C_1$-$C_3$ in the same circuit arrangement. The VCO 225 is configured to generate a VCO clock signal $F_{VCO}$ based on the VCO tune voltage $V_{tune}$. Accordingly, the VCO 225 includes a frequency control input coupled to the output of the LPF or Loop filter 220. The VCO 225 includes an output configured to produce the VCO clock signal $F_{VCO}$ The buffer 230, which may be configured as one or more cascaded inverters, includes an input coupled to the output of the VCO 225, and an output configured to produce a PLL clock signal $F_{PLL}$.

The fractional divider (Ndiv) 235 includes an input coupled to the output of the VCO 225. The fractional divider 235 is configured to frequency divide the VCO clock signal $F_{VCO}$ to generate an intermediate feedback clock signal $F_{IFB}$ based on a sequence (SEQ) generated by a sequence generator 240, such as a sigma-delta modulator. Accordingly, the sequence generator or SDM 240 includes an output coupled to a divider control input of the fractional divider 235. The sequence generator or SDM 240 is configured to generate the sequence (SEQ) based on a frequency control word (FCW) received at an input. That is, for a given clock period of the VCO clock signal $F_{VCO}$, the fractional divider 235 can divide the frequency of the VCO clock signal $F_{VCO}$ by an integer (e.g., 6 or 7). To achieve a fractional division, the fractional divider 235 has to toggle between integers to achieve an effective fractional division based on the mean value of the sequence (SEQ) generated by the sequence generator 240, as previously discussed with reference to PLL 100.

To achieve a fractional division as discussed, the fractional divider 235 has to change the divider ratio Ndiv (e.g., Ndiv=$F_{VCO}/F_{REF}$) between a set of values to achieve the desired frequency ratio Ndiv. Thus, the intermediate feedback signal $F_{IFB}$ includes a set of edges that are not timewise in the same location if the divider ratio Ndiv was an integer. Because of the moving edges, the intermediate feedback clock signal $F_{IFB}$ has quantization noise $Q_E$, which manifest itself in the frequency domain as high frequency components above the frequency of the feedback clock signal $F_{FB}$. The DTC circuitry, including the DTC control circuit 245 and the DTC 250, are configured to reduce the quantization noise $Q_E$. The same benefits discussed above resulting from a reduction in the quantization noise $Q_E$ apply with respect to this example: the bandwidth of the LPF or loop filter 220 may be widened to reduce IPN and also allow the PLL 200 to settle faster for FFH applications, and improve spot phase noise of the PLL output signal $F_{PLL}$.

In this implementation, the reduction in the quantization noise $Q_E$ operates as follows: The sequence generator or SDM 240 provides the quantization noise $Q_E$ to the DTC control circuit 245. The quantization noise $Q_E$ may be based on a difference between the current value of the sequence (SEQ) and the FCW. The DTC control circuit 245 generates the DTC_CODE based on the quantization error $Q_E$. Thus, the DTC 250 alters the edges of the intermediate feedback clock signal $F_{IFB}$ based on the quantization error $Q_E$ via the DTC_CODE, such that the edges of the feedback clock signal $F_{IFB}$ substantially correspond timewise to where the edges should be based on the divider ratio Ndiv. So, in the case of PLL 200, the DTC 200 substantially removes the quantization noise $Q_E$ from the intermediate feedback clock signal $F_{IFB}$ to generate the feedback clock signal $F_{FB}$.

A DTC, such as DTC 150 and 250, should have a substantially linear response between the DTC_CODE and the delay applied to the input clock edge. As an example, if the DTC_CODE increases by five (5) percent, the delay applied to the input clock edge should increase by substantially five (5) percent. If a DTC has a non-linear transfer function between the DTC_CODE and the edge delay produced, the amount of quantization noise $Q_E$ that the DTC can reduce may be adversely impacted. Additionally, the non-linearity associated with a DTC may produce large fractional spurs in the PLL output clock signal $F_{PLL}$ and produce quantization noise folding near the frequency of the PLL output clock signal $F_{PLL}$. Accordingly, some implementations described herein are configured to improve the linearity of a DTC. Additional considerations described herein also has to do with reducing the power consumption of a DTC.

Figure 3A:
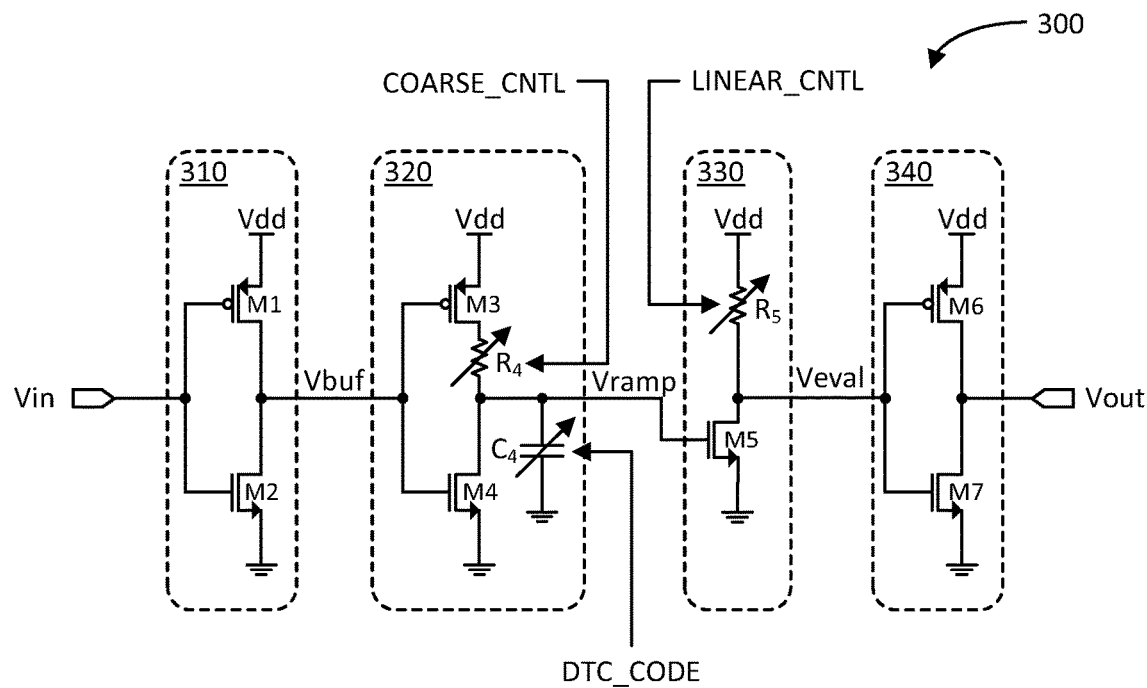
FIG. 3A illustrates a schematic diagram of an example digital-to-time converter (DTC) in accordance with another aspect of the disclosure.

FIG. 3A illustrates a schematic diagram of an example digital-to-time converter (DTC) 300 in accordance with another aspect of the disclosure. As discussed in more detail herein, the DTC 300 includes circuitry to linearize the transfer function between the delay generated by the DTC 300 and the DTC_CODE applied to the DTC 300. The DTC 300 includes an input buffer 310, a ramp voltage generator 320, an evaluation circuit 330, and an output buffer 340.

The input buffer 310 may be configured as an inverter, and includes a p-channel metal oxide semiconductor field effect transistor (PMOS FET) M1 and an n-channel metal oxide semiconductor field effect transistor (NMOS FET) M2 coupled in series between an upper voltage rail Vdd and a lower voltage rail (e.g., ground). The PMOS FET M1 includes a source coupled to the upper voltage rail Vdd, a gate coupled to a gate of the NMOS FET M2, and a drain coupled to the drain of the NMOS FET M2. The NMOS FET M2 includes a source coupled to the lower voltage rail (e.g., ground). The gates of the PMOS FET M1 and NMOS FET M2 (input of the input buffer 310) are configured to receive an input voltage Vin, and the drains of the PMOS FET M1 and NMOS FET M2 (output of the input buffer 310) are configured to produce a buffer voltage Vbuf. With regard to PLLs 100 and 200 previously discussed, the input voltage Vin may correspond to the input reference clock signal REF and to the intermediate feedback clock signal $F_{IFB}$, respectively. It shall be understood that the input buffer 310 may be implemented differently, such as one that includes a set of cascaded inverters or others that do not use inverters.

The ramp voltage generator 320 includes a PMOS FET M3, a variable resistor $R_4$ (has a variable resistance) and an NMOS FET M4 coupled in series between the upper voltage rail Vdd and the lower voltage rail (e.g., ground). The PMOS FET M3 includes a source coupled to the upper voltage rail Vdd, and a gate coupled to the drains of the PMOS FET M1 and NMOS FET M2 (output of the input buffer 310), and to a gate of the NMOS FET M4. The variable resistor $R_4$ is coupled between respective drains of the PMOS FET M3 and the NMOS FET M4. The NMOS FET M4 includes a source coupled to the lower voltage rail (e.g., ground). A variable capacitor $C_4$ is coupled between the drain of NMOS FET M4 and the lower voltage rail (e.g., ground). The gates of the PMOS FET M3 and NMOS FET M4 serve as the input of the ramp voltage generator 320, and configured to receive the buffer voltage Vbuf from the input buffer 310. The drain of the NMOS FET M4 serves as the output of the ramp voltage generator 320, and is configured to produce a ramp voltage Vramp. The resistance of the variable resistor $R_4$ is controlled by a coarse control (COARSE_CNTL) signal, and the variable capacitor $C_4$ has a variable capacitance controlled by the DTC_CODE. It shall be understood that the ramp voltage generator 320 may be implemented differently, including different implementations described further herein or others.

The evaluation circuit 330 includes a variable resistor $R_5$ coupled in series with an NMOS FET M5 between the upper voltage rail Vdd and the lower voltage rail (e.g., ground). The variable resistor $R_5$ has a variable resistance controlled by a linearization control signal (LINEAR_CNTL). The NMOS FET M5 includes a gate coupled to the drain of the NMOS FET M4 of the ramp voltage generator 320 (output of the ramp voltage generator 320). The NMOS FET M5 includes a drain configured to produce an evaluation voltage Veval, and a source coupled to the lower voltage rail (e.g., ground). The gate of the NMOS FET M5 serves as the input of the evaluation circuit 330 to receive the ramp voltage Vramp from the ramp voltage generator 320. The drain of the NMOS FET M5 serves as the output of the evaluation circuit 330. It shall be understood that evaluation circuit 330 may be implemented differently, including different implementations described further herein or others.

The output buffer 340 may be configured as an inverter, and includes a PMOS FET M6 coupled in series with an NMOS FET M7 between the upper voltage rail Vdd and the lower voltage rail (e.g., ground). The PMOS FET M6 includes a source coupled to the upper voltage rail Vdd, a gate coupled to the drain of the NMOS FET M5 of the evaluation circuit 330 (output of the evaluation circuit 330) and to the gate of the NMOS FET M7. The PMOS FET M6 includes a drain coupled to a drain of the NMOS FET M7; the common drains serves as the output of the output buffer 340. The NMOS FET M7 includes a source coupled to the lower voltage rail (e.g., ground). The gates of the PMOS FET M6 and NMOS FET M7 serve as the input of the output buffer 340, and configured to receive the evaluation voltage Veval from the evaluation circuit 330. The drains of the PMOS FET M6 and NMOS FET M7 serve as the output of the output buffer 340, and is configured to produce an output voltage Vout. With regard to PLLs 100 and 200 previously discussed, the output voltage Vout may correspond to the output reference clock signal $F_{REF}$ and to the feedback clock signal $F_{FB}$, respectively. It shall be understood that the output buffer 340 may be implemented differently, such as one that includes a set of cascaded inverters or others that do not use inverters.

In operation, when the input voltage Vin exhibits a rising edge, the PMOS FET M1 turns off and the NMOS FET M2 turns on. Accordingly, the input buffer 310 generates the buffer voltage Vbuf at a low logic level (e.g., at ground potential). This causes PMOS FET M3 to turn on and NMOS FET M4 to turn off. The turning on of PMOS FET M3 produces a charging current path from the upper voltage rail Vdd to the variable capacitor $C_4$ via the PMOS FET M3 and the variable resistor $R_4$. In response to the charging current applied to the variable capacitor $C_4$, the ramp voltage Vramp increases from ground potential to Vdd potential. The rate at which ramp voltage Vramp increases is a function of the product of resistance of the variable resistor $R_4$ and the capacitance of the variable capacitor $C_4$. The COARSE_CNTL signal coarsely controls the rise of the ramp voltage Vramp, and the DTC_CODE finely controls the rise of the ramp voltage Vramp.

When the ramp voltage Vramp rises to or above the threshold voltage of the NMOS FET M5, the NMOS FET M5 turns on. In response to the NMOS FET M5 turning on, the evaluation voltage Veval goes to ground potential. In response to the evaluation voltage Veval going to ground potential, the PMOS FET M6 turns on and the NMOS FET M7 turns off; causing the output buffer 340 to produce a rising edge in the output voltage Vout. The time delay between the rising edge of the input voltage Vin and the rising edge of the output voltage Vout is the delay applied by the DTC 300 to the input voltage Vin. The delay is a function of the rate at which the ramp voltage Vramp rises towards the threshold voltage Vth of the NMOS FET M5, which is a function of the DTC_CODE. Thus, by controlling the DTC_CODE, the delay of the DTC 300 is controlled.

Figure 3B:
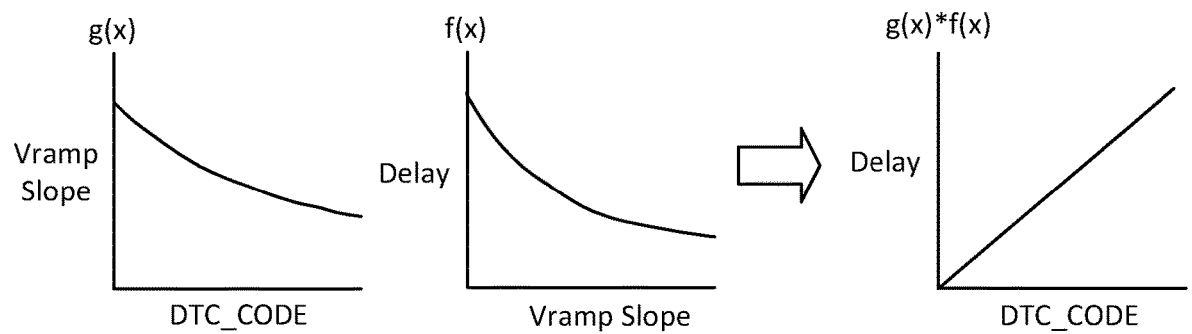
FIG. 3B illustrates graphs of different transfer functions associated with the example digital-to-time converter (DTC) of FIG. 3A in accordance with another aspect of the disclosure.

FIG. 3B illustrates graphs of different transfer functions associated with the example digital-to-time converter (DTC) of FIG. 3A in accordance with another aspect of the disclosure. There are three (3) transfer functions depicted: (1) the transfer function g(x) of the slope of the ramp voltage Vramp (y-axis) versus the DTC_CODE (x-axis) (left graph); (2) the transfer function f(x) of the delay (y-axis) generated by the DTC 300 versus the slope of the ramp voltage Vramp (x-axis) (middle graph); and (3) the combined or product transfer function g(x)*f(x) of the delay (y-axis) generated by the DTC 300 versus the DTC_CODE (x-axis) (right graph).

As indicated by the left graph, the transfer function g(x) between the ramp voltage slope and the DTC_CODE is non-linear due to the current charging of the capacitor $C_4$ via resistor $R_4$. The transfer function g(x) is non-linear in that the ramp voltage Vramp slope is negative with gradually less negativity with linear increment of the DTC_CODE. As indicated by the middle graph, the transfer function f(x) between the delay and the ramp voltage slope is non-linear due to the current charging of the current being supplied to the NMOS FET M5 via the resistor $R_5$. The transfer function g(x) is non-linear in that the delay has a negative slope with gradually less negativity with linear increment of the ramp voltage Vramp slope.

By properly selecting the resistance of variable resistor $R_5$ via the LINEAR_CNTL signal, which may be a function of the current resistance of the variable resistor $R_4$ and the current capacitance of the variable capacitor $C_4$, the non-linearity of the transfer function f(x) may substantially cancel out the non-linearity of the transfer function g(x) such that the combined or product transfer function g(x)*f(x) is substantially linear throughout the range of the DTC_CODE as illustrated in the right graph. Thus, the linearizing of the DTC 300 reduces the quantization noise $Q_E$, allows the bandwidth of the LPF or loop filter 120 or 220 to be made wider, which may reduce the IPN and may allow the PLL 100 or 200 to settle faster for FFH applications, and improve spot phase noise of the PLL output signal $F_{PLL}$.

Figure 4A:
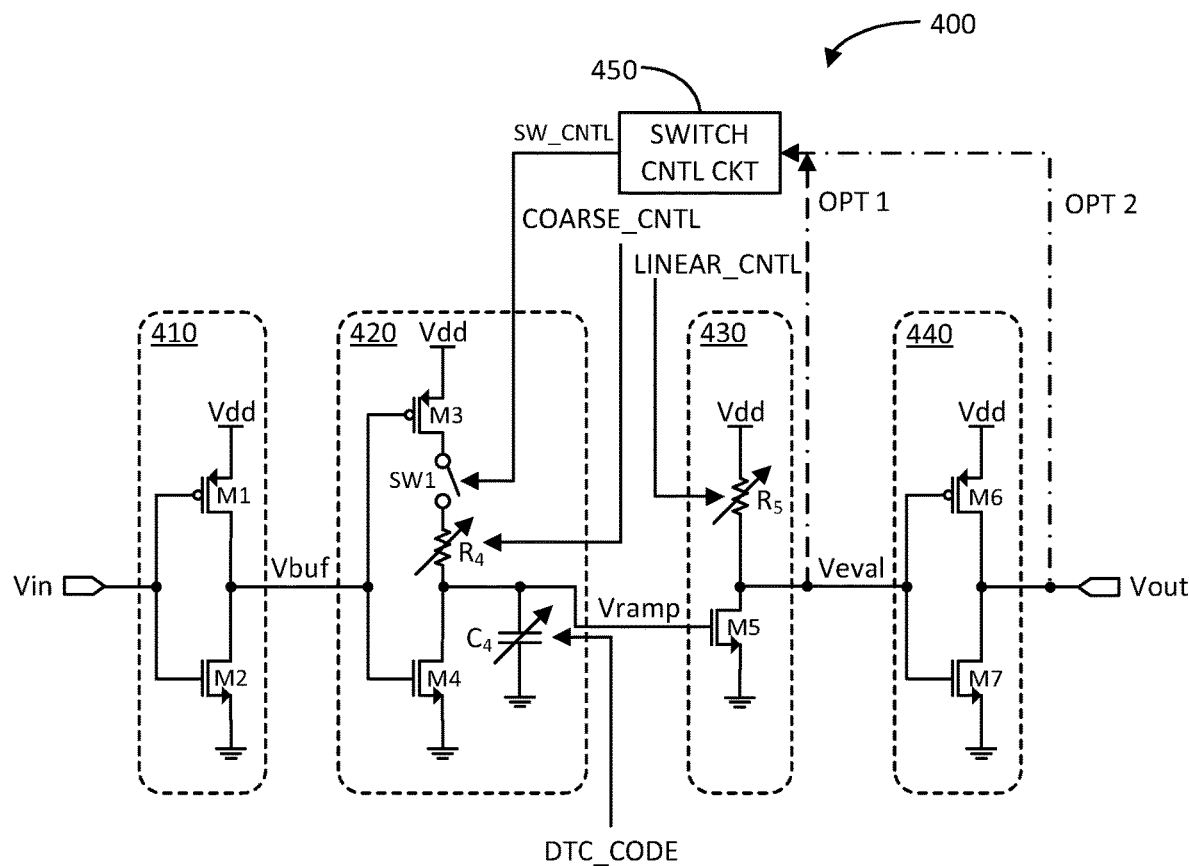
FIG. 4A illustrates a schematic diagram of another example digital-to-time converter (DTC) in accordance with another aspect of the disclosure.

FIG. 4A illustrates a schematic diagram of another example digital-to-time converter (DTC) 400 in accordance with another aspect of the disclosure. As discussed in more detail herein, the DTC 400 includes circuitry to prevent the ramp voltage Vramp from charging from ground potential all the way to Vdd potential to save power. The DTC 400 includes an input buffer 410, a ramp voltage generator 420, an evaluation circuit 430, an output buffer 440, and a switch control circuit 450. The input buffer 410 may be similar to input buffer 310 previously discussed in detail.

The ramp voltage generator 420 includes a PMOS FET M3, a switching device SW1, a variable resistor $R_4$, and an NMOS FET M4 coupled in series between the upper voltage rail Vdd and the lower voltage rail (e.g., ground). The PMOS FET M3 includes a source coupled to the upper voltage rail Vdd, and a gate coupled to the drains of the PMOS FET M1 and NMOS FET M2 (output of the input buffer 410) and to a gate of the NMOS FET M4. The switching device SW1 and the variable resistor $R_4$ are coupled in series between respective drains of the PMOS FET M3 and the NMOS FET M4. The NMOS FET M4 includes a source coupled to the lower voltage rail (e.g., ground). A variable capacitor $C_4$ is coupled between the drain of NMOS FET M4 and the lower voltage rail (e.g., ground). The gates of the PMOS FET M3 and NMOS FET M4 serve as the input of the ramp voltage generator 420, and configured to receive the buffer voltage Vbuf from the input buffer 410. The drain of the NMOS FET M4 serves as the output of the ramp voltage generator 420, and is configured to produce a ramp voltage Vramp. The resistance of the variable resistor $R_4$ is controlled by a coarse control (COARSE_CNTL) signal, and the capacitance of the variable capacitor $C_4$ is controlled by the DTC_CODE. The closed/open state of the switching device SW1 is controlled by a switch control signal SW_CNTL generated by the switch control circuit 450, as discussed in more detail herein.

The evaluation circuit 430 includes a variable resistor $R_5$ coupled in series with an NMOS FET M5 between the upper voltage rail Vdd and the lower voltage rail (e.g., ground). The resistance of the variable resistor $R_5$ is controlled by a linearization control signal (LINEAR_CNTL). The NMOS FET M5 includes a gate coupled to the drain of the NMOS FET M4 of the ramp voltage generator 420 (output of the ramp voltage generator 420). The NMOS FET M5 includes a drain configured to produce an evaluation voltage Veval, and a source coupled to the lower voltage rail (e.g., ground). The gate of the NMOS FET M5 serves as the input of the evaluation circuit 430 to receive the ramp voltage Vramp from the ramp voltage generator 420. The drain of the NMOS FET M5 serves as the output of the evaluation circuit 430.

The output buffer 440 may be similar to the output buffer 340 previously discussed in detail. In one alternative implementation, identified as option 1, the output of the evaluation circuit 430 may be coupled to an input of the switch control circuit 450. In another alternative implementation, identified as option 2, the output of the output buffer 440 may be coupled to an input of the switch control circuit 450.

Figure 4B:
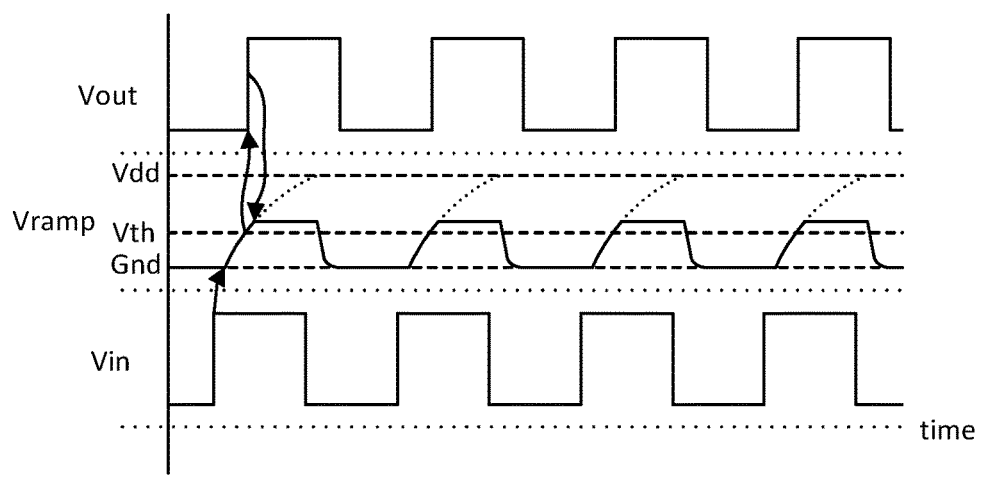
FIG. 4B illustrates a timing diagram related to an example operation of the digital-to-time converter (DTC) of FIG. 4A in accordance with another aspect of the disclosure.

FIG. 4B illustrates a timing diagram related to an example operation of digital-to-time converter (DTC) 400 in accordance with another aspect of the disclosure. The x- or horizontal axis of the graph represents time. The y- or vertical axis of the graph is divided into three parameters: (1) the output voltage Vout depicted at the top portion of the graph; (2) the ramp voltage Vramp depicted at the middle portion of the graph; and (3) the input voltage Vin depicted at the bottom portion of the graph. The example depicted pertains to option 2, where the output of the output buffer 440 is coupled to the input of the switch control circuit 450.

With reference to the graphs, the switch control circuit 450 operates as follows: When the ramp voltage Vramp begins to rise from ground potential in response to a positive edge of the input voltage Vin (as indicated by the initial arrow pointing to the ramp voltage Vramp), and the evaluation voltage Veval is at Vdd potential and the output voltage Vout is at ground potential, the switch control circuit 450 generates the SW_CNTL signal to maintain the switching device SW1 closed so that a current path is formed from the upper voltage rail Vdd to the capacitor $C_4$ via the switching device SW1 and the variable resistor $R_4$; this produces the rising ramp voltage. When the ramp voltage Vramp reaches the threshold voltage of the NMOS FET M5, the NMOS FET M5 turns on, and the evaluation voltage Veval decreases to ground potential. In response to the evaluation voltage Veval decreasing to ground potential, the output voltage Vout increases from ground potential to Vdd potential (as indicated by the arrow pointing to the rising edge of the output voltage Vout). In response to the rising edge of output voltage Vout, the switch control circuit 450 generates the SW_CNTL signal to open the switching device SW1, and stop the charging of the capacitor $C_4$ to conserve power (as indicated by the arrow pointing to the top plateau of the ramp voltage Vramp). With regard to option 1, the falling edge of the evaluation voltage Veval causes the switch control circuit 450 to generate the SW_CNTL signal to open the switching device SW1, and stop the charging of the capacitor $C_4$ to conserve power.

Figure 5A:
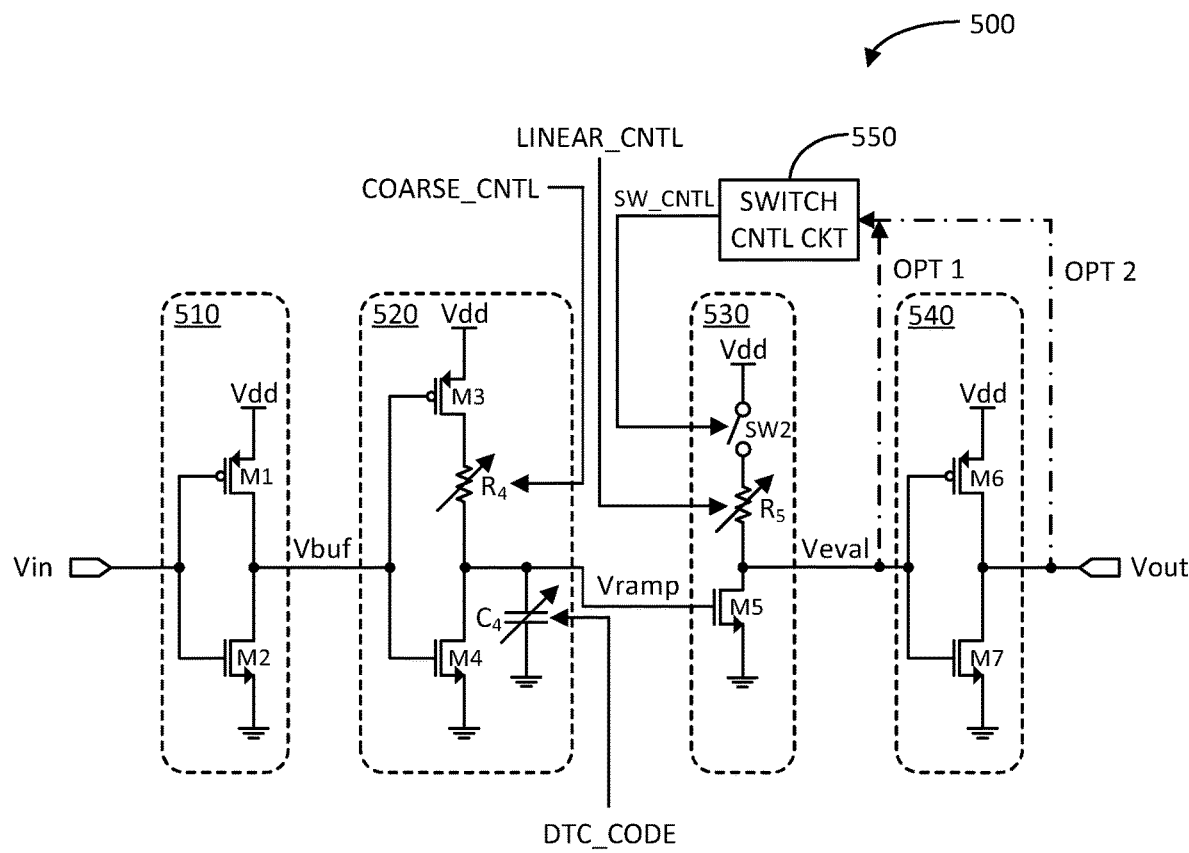
FIG. 5A illustrates a schematic diagram of another example digital-to-time converter (DTC) in accordance with another aspect of the disclosure.

FIG. 5A illustrates a schematic diagram of another example digital-to-time converter (DTC) 500 in accordance with another aspect of the disclosure. Similar to DTC 400, the DTC 500 includes circuitry to stop the current flow through the NMOS FET M5 of an evaluation circuit when the evaluation voltage Veval or the output voltage Vout exhibit a falling or rising transition, respectively.

The DTC 500 includes an input buffer 510, a ramp voltage generator 520, an evaluation circuit 530, an output buffer 540, and a switch control circuit 550. The input buffer 510 may be similar to input buffer 310 previously discussed in detail. The ramp voltage generator 520 may be similar to ramp voltage generator 320 previously discussed in detail. And the output buffer 540 may be configured similar to output buffer 440 previously discussed in detail.

The evaluation circuit 530 includes a switching device SW2, a variable resistor $R_5$ and an NMOS FET M5 coupled in series between the upper voltage rail Vdd and the lower voltage rail (e.g., ground). The closed/open state of the switching device SW2 is controlled by the switch control (SW_CNTL) signal generated by switch control circuit 550, as discussed in more detail herein. The resistance of the variable resistor $R_5$ is controlled by a linearization control signal (LINEAR_CNTL). The NMOS FET M5 includes a gate coupled to the drain of the NMOS FET M4 of the ramp voltage generator 520 (output of the ramp voltage generator 520). The NMOS FET M5 includes a drain configured to produce an evaluation voltage Veval, and a source coupled to the lower voltage rail (e.g., ground). The gate of the NMOS FET M5 serves as the input of the evaluation circuit 530 to receive the ramp voltage Vramp from the ramp voltage generator 520. The drain of the NMOS FET M5 serves as the output of the evaluation circuit 530.

In one alternative implementation, identified as option 1, the output of the evaluation circuit 530 may be coupled to an input of the switch control circuit 550. In another alternative implementation, identified as option 2, the output of the output buffer 540 may be coupled to an input of the switch control circuit 550.

Figure 5B:
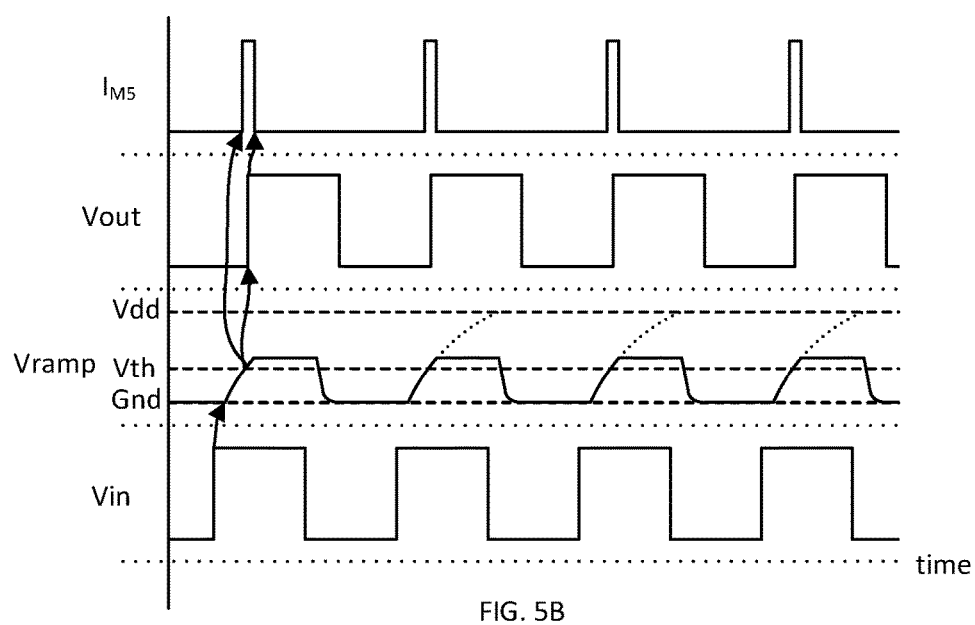
FIG. 5B illustrates a timing diagram related to an example operation of the digital-to-time converter (DTC) of FIG. 5A in accordance with another aspect of the disclosure.

FIG. 5B illustrates a timing diagram related to an example operation of the digital-to-time converter (DTC) 500 in accordance with another aspect of the disclosure. The x- or horizontal axis of the graph represents time. The y- or vertical axis of the graph is divided into four parameters: (1) the current $I_{M5}$ through NMOS FET M5; (2) the output voltage Vout depicted at the second from the top portion of the graph; (3) the ramp voltage Vramp depicted at the third from the top portion of the graph; and (4) the input voltage Vin depicted at the bottom portion of the graph. The example depicted pertains to option 2, where the output of the output buffer 540 is coupled to the input of the switch control circuit 550.

With reference to the graphs, the switch control circuit 550 operates as follows: When the ramp voltage Vramp begins to rise from ground potential in response to a positive edge of the input voltage Vin (as indicated by the initial arrow pointing to the ramp voltage Vramp), the switch control circuit 550 generates the SW_CNTL signal to maintain the switching device SW2 closed. Accordingly, the evaluation voltage Veval is at Vdd potential and the output voltage Vout is at ground potential. When the ramp voltage Vramp reaches the threshold voltage of the NMOS FET M5, the NMOS FET M5 turns on and the current $I_{M5}$ through the NMOS FET M5 increases (as indicated by the arrow pointing to the rising edge of the current $I_{M5}$). As a consequence, the evaluation voltage Veval decreases to ground potential. In response to the evaluation voltage Veval decreasing to ground potential, the output voltage Vout increases from ground potential to Vdd potential (as indicated by the arrow pointing to the rising edge of the output voltage Vout). In response to the rising edge of output voltage Vout, the switch control circuit 550 generates the SW_CNTL signal to open the switching device SW2, and stop the current flow through the NMOS FET M5 (as indicated by the arrow pointing to the falling edge of the current $I_{M5}$). With regard to option 1, the falling edge of the evaluation voltage Veval causes the switch control circuit 550 to generate the SW_CNTL signal to open the switching device SW2, and stop the current $I_{M5}$ through the NMOS FET M5.

Figure 6:
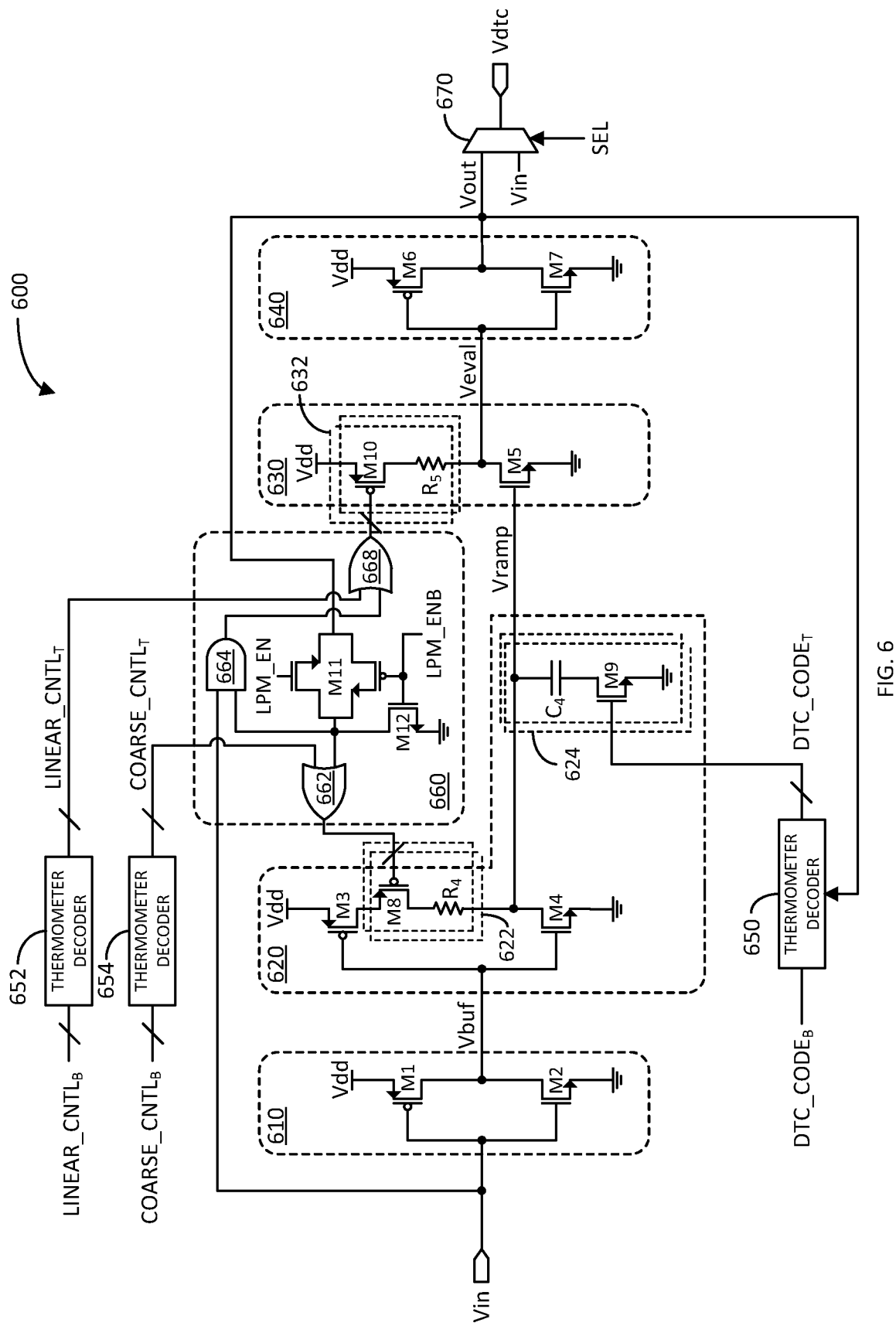
FIG. 6 illustrates a schematic diagram of another example digital-to-time converter (DTC) in accordance with another aspect of the disclosure.

FIG. 6 illustrates a schematic diagram of another example digital-to-time converter (DTC) 600 in accordance with another aspect of the disclosure. The DTC 600 is an exemplary more detailed implementation incorporating the various concepts described above.

The DTC 600 includes an input buffer 610, a ramp voltage generator 620, an evaluation circuit 630, an output buffer 640, a low power mode (LPM) circuit 660, a multiplexer 670, and a set of thermometer decoders 650, 652, and 654. The input buffer 610 and the output buffer 640 are similar to input buffer 310 and output buffer 340 previously discussed in detail, respectively.

The ramp voltage generator 620 includes a PMOS FET M3, a set of selectable resistor circuits 622, and an NMOS FET M4 coupled in series between the upper voltage rail Vdd and the lower voltage rail (e.g., ground). Each of the set of selectable resistor circuits 622 includes a PMOS FET M8 coupled in series with a resistor $R_4$. The PMOS FET M3 and the NMOS FET M4 include gates coupled together, and serve as the input of the ramp voltage generator 620 to receive the buffer voltage Vbuf from the output of the input buffer 610. The ramp voltage generator 620 further includes a set of selectable capacitor circuits 624. Each of the set of selectable capacitor circuits 624 includes a capacitor $C_4$ coupled in series with an NMOS FET M9 between the drain of NMOS FET M4 and the lower voltage rail (e.g., ground).

The evaluation circuit 630 includes a set of selectable resistor circuits 632 coupled in series with an NMOS FET M5 between the upper voltage rail Vdd and the lower voltage rail (e.g., ground). Each of the selectable resistor circuits 632 includes a PMOS FET M10 coupled in series with a resistor $R_5$. The NMOS FET M5 includes a gate, which serves as the input of the evaluation circuit 630, configured to receive the ramp voltage Vramp from the output of the ramp voltage generator 620. The NMOS FET M5 includes a drain configured to produce an evaluation voltage Veval at an output of the evaluation circuit 630.

The thermometer decoder 650 is configured to receive a $DTC\_CODE_B$, for example, from an output of the DTC control circuit 145 in PLL 100 or from an output of the DTC controller 245 in PLL 200. In this example, the $DTC\_CODE_B$ is in a binary signal or number, and the thermometer decoder 650 is configured to generate a set of thermometer codes $DTC\_CODE_T$ based on the binary signal $DTC\_CODE_B$. As an example, if the $DTC\_CODE_B$ has a bit width of four (4), then the set of thermometer codes $DTC\_CODE_T$ has 16 ($2^4$) codes. Accordingly, the thermometer decoder 650 includes a set of outputs, at which the set of thermometer codes $DTC\_CODE_T$ are generated, coupled to the gates of the NMOS FETs M9 of the set of selectable capacitor circuits 624, respectively.

The LPM circuit 660 is configured to selectively configure the DTC 600 between non-LPM mode (e.g., normal mode) and LPM mode. In LPM mode, the LPM circuit 660 turns off the set of selectable resistor circuits 622 in response to a rising edge at an output voltage Vout of the DTC 600 to prevent the ramp voltage Vramp from rising all the way up to Vdd after the rising edge of the output voltage Vout occurs. This conserves power for the DTC 600. In normal mode, the LPM circuit 660 does not turn off the set of selectable resistor circuits 622 in response to a rising edge at an output voltage Vout of the DTC 600; thereby allowing the ramp voltage Vramp to rise all the way up to Vdd potential. Thus, in normal mode, the LPM 660 is configured to maintain the switching device M8 in a closed state independent of the output voltage Vout.

Additionally, in LPM mode, the LPM circuit 660 turns off the set of selectable resistor circuits 632 in response to a rising edge at an output voltage Vout of the DTC 600 to cease the current $I_{M5}$ through the NMOS FET M5. This conserves power for the DTC 600. In normal mode, the LPM circuit 660 does not turn off the set of selectable resistor circuits 632 in response to a rising edge at an output voltage Vout of the DTC 600; thereby not ceasing the current $I_{M5}$ through the NMOS FET M5. Thus, in normal mode, the LPM 660 is configured to maintain the switching device M10 in a closed state independent of the output voltage Vout.

As described with respect to DTCs 400 and 500, it shall be understood that the LPM 660 may receive and be responsive to a falling edge of the evaluation voltage Veval instead of the rising edge of the output voltage Vout to turn off the sets of selectable resistor circuits 622 and 632. In such case, one or more logic components may be modified, added, and/or eliminated so that the LPM 660 responds as described above to the falling edge of the evaluation voltage Veval instead of a rising edge of the output voltage Vout.

The LPM circuit 660 is associated with the thermometer decoders 652 and 654. The thermometer decoder 652 is configured to receive a binary signal LINEAR_CNTL$_B$ and generate a set of thermometer codes LINEAR_CNTL$_T$ based on binary number LINEAR_CNTL$_B$ signal. As an example, if the LINEAR_CNTL$_B$ has a bit width of two (2), then the set of thermometer codes LINEAR_CNTL$_T$ has 4 ($2^2$) codes. Accordingly, the thermometer decoder 652 includes a set of outputs, at which the set of thermometer codes LINEAR_CNTL$_T$ are generated.

The thermometer decoder 654 is configured to receive a binary signal COARSE_CNTL$_B$ and generate a set of thermometer codes COARSE_CNTL$_T$ based on binary number COARSE_CNTL$_B$ signal. As an example, if the COARSE_CNTL$_B$ has a bit width of two (2), then the set of thermometer codes COARSE_CNTL$_T$ has 4 ($2^2$) codes. Accordingly, the thermometer decoder 654 includes a set of outputs, at which the set of thermometer codes COARSE_CNTL$_T$ are generated.

The LPM circuit 660 includes a first set of OR gates 662, an AND gate 664, a second set of OR gates 668, a pass or transmission gate M11, and an NMOS FET M12. The first set of OR gates 662 includes a first set of inputs coupled to the set of outputs of the thermometer decoder 654, and a second set of inputs coupled to an output of the transmission gate M11, a first input of the AND gate 664, and a drain of the NMOS FET M12. The first set of OR gates 662 includes a set of outputs coupled to the gates of the set of PMOS FETs M8 of the set of selectable resistor circuits 622, respectively.

The AND gate 664 includes a second input coupled to the input of the DTC 600 to receive the input voltage Vin. The second set of OR gates 668 includes a first set of inputs coupled to the set of outputs of the thermometer decoder 652, and a second set of inputs coupled to an output of the AND gate 664. The second set of OR gates 668 includes a set of outputs coupled to the gates of the set of PMOS FETs M10 of the set of selectable resistor circuits 632, respectively.

The transmission gate M11 includes an input coupled to the output of the output buffer 640, e.g., configured to receive the output voltage Vout. The transmission gate M11 includes non-complementary and complementary control inputs configured to receive non-complementary and complementary low power mode enable signals LPM_EN and LPM_ENB, respectively. The NMOS FET M12 includes a gate configured to receive the complementary LPM_ENB signal, and a source coupled to the lower voltage rail (e.g., ground).

The DTC 600 further includes a multiplexer 670 including a first input coupled to the output of the output buffer 640 to receive the output voltage Vout, and a second input coupled to the input of the input buffer 610 to receive the input voltage Vin. The multiplexer 670 includes a select input to receive a select (SEL) signal, and an output configured to produce a DTC voltage Vdtc, which may correspond to the output clock reference signal $F_{REF}$ in the PLL 100 and a feedback clock signal $F_{FB}$ in the PLL 200. The output of the output buffer 640 is coupled to a control input of the thermometer decoder 650 such that the DTC_CODE$_T$ is not applied to the set of selectable capacitor circuit 624 until the capacitor $C_4$ is fully discharged or reset.

In operation, a rising edge of the input voltage Vin causes buffer voltage Vbuf to go to ground potential. The buffer voltage Vbuf going to ground potential turns on PMOS FET M3 (and turns off NMOS FET M4). The number of PMOS FETs M8 in the closed state (turned on) is set by the COARSE_CNTL$_B$ signal via the thermometer decoder 654, and the COARSE_CNTL$_T$ signal applied to the first inputs of the PMOS FETs M8 via the set of OR gates 662. This controls the $R_4$ resistance contribution in the charging of the capacitor $C_4$. The DTC_CODE$_B$, via the thermometer decoder 650 to generate the set of DTC_CODE$_T$ signals, turns on a specific number of NMOS FETs M9 of the set of selectable capacitors 624 to achieve a desired capacitance for generating the ramp voltage Vramp.

When the ramp voltage Vramp reaches or exceeds the threshold voltage Vth of the NMOS FET M5, the NMOS FET M5 turns on, and draws current $I_{M5}$ from the upper voltage rail Vdd, the number of PMOS FETs M10 turned on, and the set of resistors $R_5$ associated with the number of PMOS FETs M10 turned on. The number of PMOS FETs M10 turned on is controlled by the LINEAR_CNTL$_B$ signal, the thermometer decoder 652, the LINEAR_CNTL$_T$ signals, and the set of OR gates 668. As previously discussed, this is so the transfer function f(x) associated with the evaluation circuit 630 is substantially inverse to the transfer function g(x) associated with the ramp voltage generator 620, as discussed with reference to FIG. 3B.

In response to the NMOS FET M5 turning on, the evaluation voltage Veval decreases to ground potential; thereby, turning on PMOS FET M6 and turning off NMOS FET M7 of the output buffer 640. Accordingly, the output voltage Vout experiences a rising edge. The rising edge is applied to the PMOS FETs M8 of the set of selectable resistor circuits 622 based on the COARSE_CNTL$_B$ signal via the enabled transmission gate M11 by the LPM_EN/LPM_EMB complementary signals, and the set of OR gates 662 to turn off the corresponding turned-on PMOS FETs M8 to prevent the further charging of the enabled capacitors $C_4$ of the set of selectable capacitor circuits 624 and stop the rising ramp voltage Vramp. As previously discussed, this conserves power for the DTC 600.

Similarly, the rising edge of the output voltage Vout is applied to the first input of the AND gate 664 via the transmission gate M11, and the high logic voltage (e.g., Vdd) of input voltage Vin applied to the second input of the AND gate 664, causes the AND gate 664 to generate a high logic voltage to enable the set of OR gates 668. Based on the LINEAR_CNTL$_B$ signal, the turned-on PMOS FETs M10 of the set of selectable resistor circuits 632 are turned off or configured in their open state in response to the rising edge of the output voltage Vout via the transmission gate M11, the AND gate 664, and the set of OR gates 668, prevent current $I_{M5}$ through the NMOS FET M5. As previously discussed, this conserves power for the DTC 600.

The rising edge of the output voltage Vout also disables the thermometer decoder 650 to cause the thermometer decoder 650 to retime the generation of the DTC_CODE$_T$ at high logic voltage (e.g., Vdd) after the set of selectable capacitors circuits 624 to discharge or reset. Additionally, with regard to the multiplexer 670, if the select (SEL) signal is in a first state, the multiplexer 670 outputs the output voltage Vout as the DTC voltage Vdtc. If the select (SEL) signal is in a second state, the multiplexer 670 outputs the input voltage Vin as the DTC voltage Vdtc. This allows the input voltage Vin to bypass the DTC 600.

Figure 7:
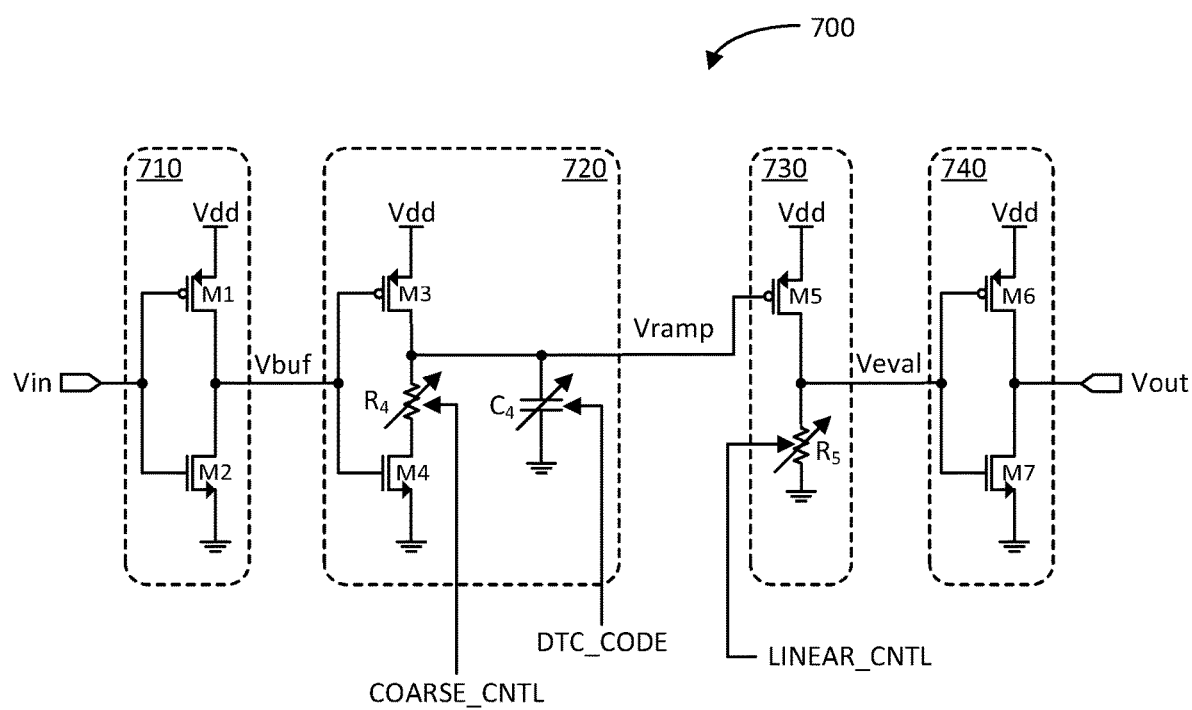
FIG. 7 illustrates a schematic diagram of another example digital-to-time converter (DTC) in accordance with another aspect of the disclosure.

FIG. 7 illustrates a schematic diagram of another example digital-to-time converter (DTC) 700 in accordance with another aspect of the disclosure. The DTC 700 is similar to DTC 300 previously discussed, with a few exceptions: (1) the DTC 700 responds to a falling edge of the input voltage Vin; (2) the delay applied by the DTC 700 is a falling edge to falling edge delay (but additional inverters may be placed at the input and output to achieve a rising edge to rising edge delay); (3) the ramp voltage Vramp decreases from Vdd to the threshold voltage of PMOS FET M5 of the evaluation circuit; and accordingly, (4) the ramp voltage generator and the evaluation circuit are reconfigured to implement the aforementioned characteristics. More specifically, the DTC 700 includes an input buffer 710, a ramp voltage generator 720, an evaluation circuit 730, and an output buffer 740.

The input buffer 710 may be configured as an inverter per input buffer 310, including PMOS FET M1 and NMOS FET M2 coupled in series between an upper voltage rail Vdd and a lower voltage rail (e.g., ground). The PMOS FET M1 includes a source coupled to the upper voltage rail Vdd, a gate coupled to a gate of the NMOS FET M2, and a drain coupled to a drain of the NMOS FET M2. The NMOS FET M2 includes a source coupled to the lower voltage rail (e.g., ground). The gates of the PMOS FET M1 and NMOS FET M2 (input of the input buffer 710) are configured to receive an input voltage Vin, and the drains of the PMOS FET M1 and NMOS FET M2 (output of the input buffer 710) are configured to produce a buffer voltage Vbuf.

The ramp voltage generator 720 includes a PMOS FET M3, a variable resistor $R_4$ (its resistance is variable), and an NMOS FET M4 coupled in series between the upper voltage rail Vdd and the lower voltage rail (e.g., ground). The PMOS FET M3 includes a source coupled to the upper voltage rail Vdd, a gate coupled to the drains of the PMOS FET M1 and NMOS FET M2 (output of the input buffer 710), and to a gate of the NMOS FET M4. The ramp voltage generator 720 further includes a variable capacitor $C_4$ (its capacitance is variable) coupled between the drain of PMOS FET M3 and the lower voltage rail (e.g., ground). The gates of the PMOS FET M3 and NMOS FET M4 serve as the input of the ramp voltage generator 720, and configured to receive the buffer voltage Vbuf from the input buffer 710. The drain of the PMOS FET M3 serves as the output of the ramp voltage generator 720 to produce a ramp voltage Vramp. The resistance of the variable resistor $R_4$ is controlled by a coarse control (COARSE_CNTL) signal, and the capacitance of the variable capacitor $C_4$ is controlled by the DTC_CODE.

The evaluation circuit 730 includes a PMOS FET M5 coupled in series with a variable resistor $R_5$ between the upper voltage rail Vdd and the lower voltage rail (e.g., ground). The resistance of the variable resistor $R_5$ is controlled by a linearization control signal (LINEAR_CNTL). The PMOS FET M5 includes a gate coupled to the drain of the PMOS FET M3 of the ramp voltage generator 720 (output of the ramp voltage generator 720). The PMOS FET M5 includes a drain configured to produce an evaluation voltage Veval, and a source coupled to the upper voltage rail Vdd. The gate of the PMOS FET M5 serves as the input of the evaluation circuit 730 to receive the ramp voltage Vramp from the ramp voltage generator 720. The drain of the PMOS FET M5 serves as the output of the evaluation circuit 730.

The output buffer 740 may be configured as an inverter per output buffer 340, including a PMOS FET M6 coupled in series with an NMOS FET M7 between the upper voltage rail Vdd and the lower voltage rail (e.g., ground). The PMOS FET M6 includes a source coupled to the upper voltage rail Vdd, a gate coupled to the drain of the PMOS FET M5 of the evaluation circuit 730 (output of the evaluation circuit 730), and to the gate of the NMOS FET M7. The PMOS FET M6 includes a drain coupled to a drain of the NMOS FET M7; the common drains serve as the output of the output buffer 740. The NMOS FET M7 includes a source coupled to the lower voltage rail (e.g., ground). The gates of the PMOS FET M6 and NMOS FET M7 serve as the input of the output buffer 740, and configured to receive the evaluation voltage Veval from the evaluation circuit 730. The drains of the PMOS FET M6 and NMOS FET M7 serve as the output of the output buffer 740, and is configured to produce an output voltage Vout.

In operation, when the input voltage Vin exhibits a falling edge, the PMOS FET M1 turns on and the NMOS FET M2 turns off. Accordingly, the input buffer 710 generates the buffer voltage Vbuf at a high logic level (e.g., at Vdd). This causes PMOS FET M3 to turn off and NMOS FET M4 to turn on. The turning on of NMOS FET M4 produces a discharging current path from the variable capacitor $C_4$ to the lower voltage rail (e.g., ground) via the variable resistor $R_4$ and the NMOS FET M4. In response to the discharging current from the variable capacitor $C_4$, the ramp voltage Vramp decreases from Vdd potential towards ground. The rate at which ramp voltage Vramp decreases is a function of the product of resistance of the variable resistor $R_4$ and the capacitance of the variable capacitor $C_4$. The COARSE_CNTL signal coarsely controls the slope of the ramp voltage Vramp, and the DTC_CODE finely controls the slope of the ramp voltage Vramp.

When the ramp voltage Vramp falls to or below the threshold voltage of the PMOS FET M5, the PMOS FET M5 turns on. In response to the PMOS FET M5 turning on, the evaluation voltage Veval goes to Vdd potential. In response to the evaluation voltage Veval going to Vdd potential, the PMOS FET M6 turns off and the NMOS FET M7 turns on; causing the output buffer 740 to produce a falling edge in the output voltage Vout. The time delay between the falling edge of the input voltage Vin and the falling edge of the output voltage Vout is the delay applied by the DTC 700 to the input voltage Vin. The delay is a function of the rate at which the ramp voltage Vramp falls towards the threshold voltage Vth of the PMOS FET M5, which is a function of the DTC_CODE. Thus, by controlling the DTC_CODE, the delay of the DTC 300 is controlled.

The DTC 700 may be configured with similar circuitry as the DTC 400 to prevent the ramp voltage Vramp from decreasing all the way to ground potential. For example, the circuitry would stop the ramp voltage Vramp from decreasing after the threshold voltage of the PMOS FET M5 has been reached. Similarly, the DTC 700 may be configured with similar circuitry as the DTC 500 to prevent current flow through the PMOS FET M5 after the evaluation voltage Veval or the output voltage Vout has changed state.

Figure 8:
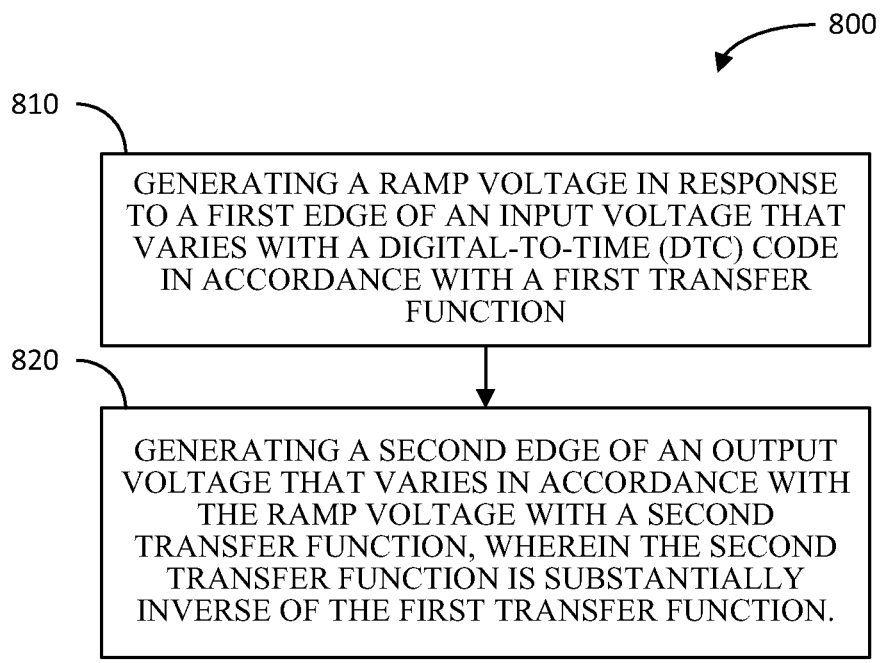
FIG. 8 illustrates a flow diagram of an example method of performing digital-to-time conversion in accordance with another aspect of the disclosure.

FIG. 8 illustrates a flow diagram of the example method 800 of performing digital-to-time conversion in accordance with another aspect of the disclosure. The method 800 includes generating a ramp voltage in response to a first edge of an input voltage that varies with a digital-to-time (DTC) code in accordance with a first transfer function (block 810). Examples of means for generating a ramp voltage in response to a first edge of an input voltage that varies with a digital-to-time (DTC) code in accordance with a first transfer function include any of the ramp voltage generators discussed herein.

The method 800 further includes generating a second edge of an output voltage that varies with the ramp voltage in accordance with a second transfer function, wherein the second transfer function is substantially inverse of the first transfer function (block 820). Examples of means for generating a second edge of an output voltage that varies with the ramp voltage with a second transfer function, wherein the second transfer function is substantially inverse of the first transfer function include any of the evaluation circuits described herein.

Figure 9:
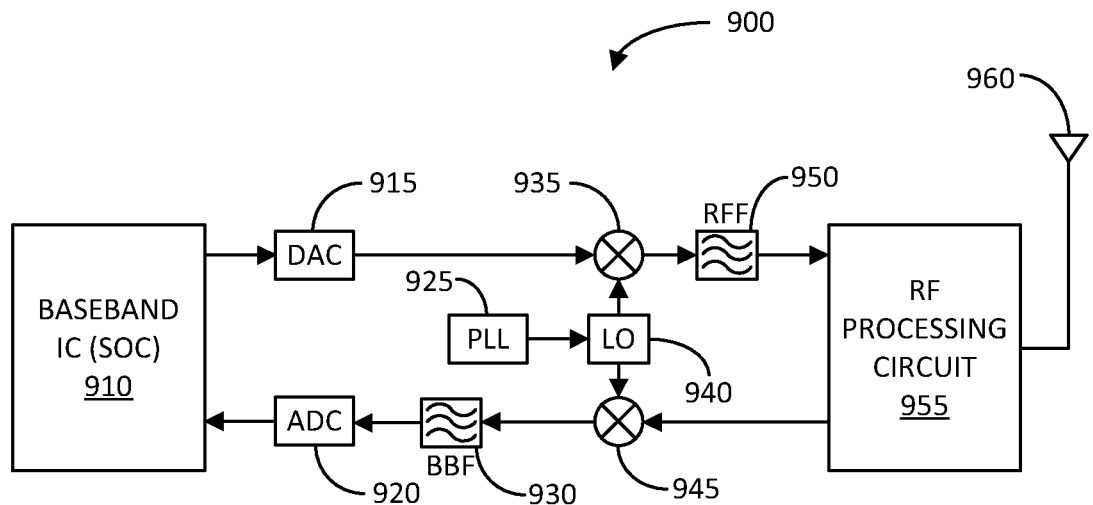
FIG. 9 illustrates a block diagram of an example wireless communication device in accordance with another aspect of the disclosure.

FIG. 9 illustrates a block diagram of an example wireless communication device 900 in accordance with another aspect of the disclosure. The wireless communication device 900 includes a baseband integrated circuit (IC) or system on chip (SOC) 910, a digital-to-analog converter (DAC) 915, a first mixer 935, a radio frequency filter (RFF) 935, an RF processing circuit 955, at least one antenna 960, a phase locked loop (PLL) 925, a local oscillator (LO) 940, a second mixer 945, a baseband filter (BBF) 930, and an analog-to-digital converter (ADC) 920.

The baseband SOC 910 generates a digital BB signal for transmission in accordance with a particular application. The DAC 915 converts the digital BB signal into an analog BB signal. The PLL 925, which may be configured per PLL 100 or 200 (including the DTCs described herein), generates a reference signal. The LO 940 generates first and second LO signals. The first mixer 935 frequency up-converts the analog BB signal into an RF signal (but it shall be understood that one or more other frequency up-conversion, such as into an intermediate frequency (IF), may occur in the wireless communication device 900). The RFF 950 filters the RF signal generated by the first mixer 935. The RF processing circuit 955 may perform various processes to the filtered RF signal, including pre-amplification, phase shifting, power amplification, and others. The processed RF signal outputted by the RF processing circuit 955 is applied to the at least one antenna 960 for transmission to one or more other wireless communication devices.

The at least one antenna 960 may receive an RF signal transmitted by a remote wireless device. The RF processing circuit 955 may perform various processes on the RF signal from the at least one antenna 960, including low noise amplification, phase shifting, additional amplification, etc. to generate a received RF signal. The second mixer 945 frequency down-converts the received RF signal using a second LO generated by the LO 940 to generate an analog baseband signal (but it shall be understood that one or more other frequency down-conversion, such as into an intermediate frequency (IF), may occur in the wireless communication device 900). The BBF 930 filters the analog baseband signal from the second mixer 945. The ADC 920 converts the analog baseband signal into a digital baseband signal. And, the baseband SOC 910 may process the digital baseband signal in accordance with a particular application.

The following provides an overview of aspects of the present disclosure:

Aspect 1: An apparatus, including: an input buffer including an input configured to receive an input voltage; a ramp voltage generator including an input coupled to an output of the input buffer; an evaluation circuit including an input coupled to an output of the ramp voltage generator, wherein the evaluation circuit includes a first resistor coupled in series with a first field effect transistor (FET) between a first voltage rail and a second voltage rail; and an output buffer including an input coupled to a drain of the first FET and an output configured to generate an output voltage.

Aspect 2: The apparatus of aspect 1, wherein the input buffer comprises a second FET and a third FET coupled in series between the first voltage rail and the second voltage rail, wherein the second and third FETs include gates configured to receive the input voltage, and wherein the second and third FETs include drains coupled to the input of the ramp voltage generator.

Aspect 3: The apparatus of aspect 2, wherein the second FET comprises a p-channel metal oxide semiconductor field effect transistor (PMOS FET), and the third FET includes an n-channel metal oxide semiconductor field effect transistor (NMOS FET).

Aspect 4: The apparatus of any one of aspects 1-3, wherein the ramp voltage generator includes a second FET, a second resistor, and a third FET coupled in series between the first voltage rail and the second voltage rail, and a capacitor coupled between a drain of the third FET and the second voltage rail.

Aspect 5: The apparatus of aspect 4, wherein the second resistor has a variable resistance controllable by a control signal.

Aspect 6: The apparatus of aspect 5, wherein the ramp voltage generator is configured to generate a ramp voltage at the output of the ramp voltage generator, wherein a slope of the ramp voltage is controlled by the control signal.

Aspect 7: The apparatus of any one of aspects 4-6, wherein the capacitor has a variable capacitance controllable by a control signal.

Aspect 8: The apparatus of aspect 7, wherein the ramp voltage generator is configured to generate a ramp voltage at an output of the ramp voltage generator, wherein a slope of the ramp voltage is controlled by the control signal.

Aspect 9: The apparatus of aspect 7 or 8, wherein the control signal comprises a digital-to-time converter (DTC) code.

Aspect 10: The apparatus of any one of aspects 4-9, wherein the ramp voltage generator comprises a switching device coupled in series with the second resistor, wherein a closed/open state of the switching device is controlled by a control signal.

Aspect 11: The apparatus of aspect 10, further comprising a switch control circuit including an input coupled to an output of the output buffer, and an output configured to generate the control signal.

Aspect 12: The apparatus of aspect 10, further comprising a switch control circuit including an input coupled to an output of the evaluation circuit, and an output configured to generate the control signal.

Aspect 13: The apparatus of any one of aspects 10-12, further comprising a low power mode (LPM) circuit configured to maintain the switching device in a closed state independent of the output voltage in a first mode, and configure the switching device in an open or closed state responsive to the output voltage in a second mode.

Aspect 14: The apparatus of any one of aspects 1-13, wherein the first resistor has a variable resistance controlled by a first control signal.

Aspect 15: The apparatus of aspect 14, wherein the ramp voltage generator is configured to generate a ramp voltage, and wherein the variable resistance is configured such that a first function of a delay between a first edge of the input voltage and a second edge of the output voltage versus the ramp voltage varies substantially inverse with a second function of the ramp voltage versus a second control signal configured to control a capacitance associated with generating the ramp voltage.

Aspect 16: The apparatus of any one of aspects 1-15, wherein the evaluation circuit includes a switching device coupled in series with the first resistor, wherein a closed/open state of the switching device is controlled by a control signal.

Aspect 17: The apparatus of aspect 16, further comprising a switch control circuit including an input coupled to an output of the output buffer, and an output configured to generate the control signal.

Aspect 18: The apparatus of aspect 16, further comprising a switch control circuit including an input coupled to the output of the evaluation circuit, and an output configured to generate the control signal.

Aspect 19: The apparatus of any one of aspects 16-18, further comprising a low power mode (LPM) circuit configured to maintain the switching device in a closed state independent of the output voltage in a first mode, and configure the switching device in an open or closed state in response to the output voltage in a second mode.

Aspect 20: The apparatus of aspect 19, wherein the LPM circuit is further configured to maintain the switching device in the open or closed state in response to the input voltage.

Aspect 21: The apparatus of any one of aspects 1-20, further comprising a multiplexer including a first input coupled to the output of the output buffer, a second input coupled to the input of the input buffer, a select input configured to receive a select signal, and an output configured to output the input voltage or the output voltage based on the select signal.

Aspect 22: The apparatus of any one of aspects 1-21, wherein: the ramp voltage generator comprises a set of selectable resistor circuits coupled in series with a set of selectable capacitor circuits between the first voltage rail and the second voltage rail; a first thermometer decoder configured to generate a first set of control signals in response to a first binary signal, wherein the first set of control signals control the set of selectable resistor circuits; and a second thermometer decoder configured to generate a second set of control signals in response to a second binary signal, wherein the second set of control signals control the set of selectable capacitor circuits.

Aspect 23: A method, including: generating a ramp voltage in response to a first edge of an input voltage that varies with a digital-to-time (DTC) code in accordance with a first transfer function; and generating a second edge of an output voltage that varies with the ramp voltage in accordance with a second transfer function, wherein the second transfer function is substantially inverse of the first transfer function.

Aspect 24: The method of aspect 23, further comprising ceasing the ramp voltage in response to the second edge of the output voltage.

Aspect 25: The method of aspect 23 or 24, further including: generating an evaluation voltage in response to the ramp voltage reaching or exceed a threshold voltage of a transistor, wherein the second edge of the output voltage is responsive to the evaluation voltage; and ceasing the ramp voltage in response to a third edge of the evaluation voltage.

Aspect 26: The method of any one of aspects 23-25, further comprising: generating an evaluation voltage in response to the ramp voltage reaching or exceed a threshold voltage of a transistor, wherein the second edge of the output voltage is responsive to the evaluation voltage; and ceasing a current flow through the transistor in response to the second edge of the output voltage or a third edge of the evaluation voltage.

Aspect 27: An apparatus, including: means for generating a ramp voltage in response to a first edge of an input voltage that varies with a digital-to-time (DTC) code in accordance with a first transfer function; and means for generating a second edge of an output voltage that varies with the ramp voltage in accordance with a second transfer function, wherein the second transfer function is substantially inverse of the first transfer function.

Aspect 28: The apparatus of aspect 27, further including: means for ceasing the ramp voltage in response to the second edge of the output voltage; means for generating an evaluation voltage in response to the ramp voltage reaching or exceed a threshold voltage of a transistor, wherein the second edge of the output voltage is responsive to the evaluation voltage; and means for ceasing the ramp voltage in response to a third edge of the evaluation voltage.

Aspect 29: The apparatus of aspect 27 or 28, further including: means for generating an evaluation voltage in response to the ramp voltage reaching or exceed a threshold voltage of a transistor, wherein the second edge of the output voltage is responsive to the evaluation voltage; and means for ceasing a current flow through the transistor in response to the second edge of the output voltage or a third edge of the evaluation voltage.

Aspect 30: A wireless communication device, including: a phase locked loop (PLL) configured to generate a PLL signal, wherein the PLL includes a digital-to-time converter (DTC) including: an input buffer configured to receive an input voltage; a ramp voltage generator coupled to the input buffer; an evaluation circuit coupled to the ramp voltage generator, wherein the evaluation circuit includes a first resistor coupled in series with a first field effect transistor (FET) between a first voltage rail and a second voltage rail; and an output buffer coupled to a drain of the first FET configured to provide an output voltage; a local oscillator (LO) configured to generate an LO signal based on the PLL signal; and a mixer configured to generate a baseband signal, intermediate frequency signal, or radio frequency signal based on the LO signal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   an input buffer including an input configured to receive an input voltage;
   a ramp voltage generator including an input coupled to an output of the input buffer;
   an evaluation circuit including an input coupled to an output of the ramp voltage generator, wherein the evaluation circuit includes a first resistor coupled in series with a first field effect transistor (FET) between a first voltage rail and a second voltage rail, wherein the first resistor has a variable resistance controlled by a first control signal; and
   an output buffer including an input coupled to a drain of the first FET and an output configured to generate an output voltage;
   wherein the ramp voltage generator is configured to generate a ramp voltage, and wherein the variable resistance is configured such that a first function of a delay between a first edge of the input voltage and a second edge of the output voltage versus the ramp voltage varies substantially inverse with a second function of the ramp voltage versus a second control signal configured to control a capacitance associated with generating the ramp voltage.

2. The apparatus of claim 1, wherein the input buffer comprises a second FET and a third FET coupled in series between the first voltage rail and the second voltage rail, wherein the second and third FETs include gates configured to receive the input voltage, and wherein the second and third FETs include drains coupled to the input of the ramp voltage generator.

3. The apparatus of claim 2, wherein the second FET comprises a p-channel metal oxide semiconductor field effect transistor (PMOS FET), and the third FET comprises an n-channel metal oxide semiconductor field effect transistor (NMOS FET).

4. The apparatus of claim 1, wherein the ramp voltage generator comprises a second FET, a second resistor, and a third FET coupled in series between the first voltage rail and the second voltage rail, and a capacitor coupled between a drain of the third FET and the second voltage rail.

5. The apparatus of claim 4, wherein the second resistor has a variable resistance controllable by a control signal.

6. The apparatus of claim 5, wherein the ramp voltage generator is configured to generate a ramp voltage at the output of the ramp voltage generator, wherein a slope of the ramp voltage is controlled by the control signal.

7. The apparatus of claim 4, wherein the capacitor includes the capacitance associated with generating the ramp voltage.

8. The apparatus of claim 7, wherein the ramp voltage generator is configured to generate the ramp voltage at an output of the ramp voltage generator, wherein a slope of the ramp voltage is controlled by the second control signal.

9. The apparatus of claim 7, wherein the second control signal comprises a digital-to-time converter (DTC) code.

10. The apparatus of claim 4, wherein the ramp voltage generator comprises a switching device coupled in series with the second resistor, wherein a closed/open state of the switching device is controlled by a control signal.

11. The apparatus of claim 10, further comprising a switch control circuit including an input coupled to an output of the output buffer, and an output configured to generate the control signal.

12. The apparatus of claim 10, further comprising a switch control circuit including an input coupled to an output of the evaluation circuit, and an output configured to generate the control signal.

13. The apparatus of claim 10, further comprising a low power mode (LPM) circuit configured to maintain the switching device in a closed state independent of the output voltage in a first mode, and configure the switching device in an open or closed state responsive to the output voltage in a second mode.

14. The apparatus of claim 1, wherein the evaluation circuit includes a switching device coupled in series with the first resistor, wherein a closed/open state of the switching device is controlled by a control signal.

15. The apparatus of claim 14, further comprising a switch control circuit including an input coupled to an output of the output buffer, and an output configured to generate the control signal.

16. The apparatus of claim 14, further comprising a switch control circuit including an input coupled to the output of the evaluation circuit, and an output configured to generate the control signal.

17. The apparatus of claim 14, further comprising a low power mode (LPM) circuit configured to maintain the switching device in a closed state independent of the output voltage in a first mode, and configure the switching device in an open or closed state in response to the output voltage in a second mode.

18. The apparatus of claim 17, wherein the LPM circuit is further configured to maintain the switching device in the open or closed state in response to the input voltage.

19. The apparatus of claim 1, further comprising a multiplexer including a first input coupled to the output of the output buffer, a second input coupled to the input of the input buffer, a select input configured to receive a select signal, and an output configured to output the input voltage or the output voltage based on the select signal.

20. The apparatus of claim 1, wherein:
the ramp voltage generator comprises a set of selectable resistor circuits coupled in series with a set of selectable capacitor circuits between the first voltage rail and the second voltage rail;
a first thermometer decoder configured to generate a first set of control signals in response to a first binary signal, wherein the first set of control signals control the set of selectable resistor circuits; and
a second thermometer decoder configured to generate the second control signal as a second set of control signals in response to a second binary signal, wherein the second set of control signals control the set of selectable capacitor circuits.

21. A method, comprising:
generating a ramp voltage in response to a first edge of an input voltage that varies with a digital-to-time (DTC) code in accordance with a first transfer function;
generating a second edge of an output voltage that varies with the ramp voltage in accordance with a second transfer function; and
controlling the second transfer function to substantially linearize a third transfer function related to a delay between the first and second edges and the DTC code, wherein the third transfer function is related to a product of the first and second transfer functions.

22. The method of claim 21, further comprising ceasing the ramp voltage in response to the second edge of the output voltage.

23. The method of claim 21, further comprising:
generating an evaluation voltage in response to the ramp voltage reaching or exceed a threshold voltage of a transistor, wherein the second edge of the output voltage is responsive to the evaluation voltage; and
ceasing the ramp voltage in response to an third edge of the evaluation voltage.

24. The method of claim 21, further comprising:
generating an evaluation voltage in response to the ramp voltage reaching or exceed a threshold voltage of a transistor, wherein the second edge of the output voltage is responsive to the evaluation voltage; and
ceasing a current flow through the transistor in response to the second edge of the output voltage or a third edge of the evaluation voltage.

25. An apparatus, comprising:
means for generating a ramp voltage in response to a first edge of an input voltage that varies with a digital-to-time (DTC) code in accordance with a first transfer function; and
means for generating a second edge of an output voltage that varies with the ramp voltage in accordance with a second transfer function; and
means for controlling the second transfer function to substantially linearize a third transfer function related to a delay between the first and second edges and the DTC code, wherein the third transfer function is related to a product of the first and second transfer functions.

26. The apparatus of claim 25, further comprising:
means for ceasing the ramp voltage in response to the second edge of the output voltage;
means for generating an evaluation voltage in response to the ramp voltage reaching or exceed a threshold voltage of a transistor, wherein the second edge of the output voltage is responsive to the evaluation voltage; and
means for ceasing the ramp voltage in response to a third edge of the evaluation voltage.

27. The apparatus of claim 25, further comprising:
means for generating an evaluation voltage in response to the ramp voltage reaching or exceed a threshold voltage of a transistor, wherein the second edge of the output voltage is responsive to the evaluation voltage; and
means for ceasing a current flow through the transistor in response to the second edge of the output voltage or a third edge of the evaluation voltage.

28. A wireless communication device, comprising:
a phase locked loop (PLL) configured to generate a PLL signal, wherein the PLL includes a digital-to-time converter (DTC) comprising:
  an input buffer configured to receive an input voltage;
  a ramp voltage generator coupled to the input buffer;
  an evaluation circuit coupled to the ramp voltage generator, wherein the evaluation circuit includes a first resistor coupled in series with a first field effect transistor (FET) between a first voltage rail and a second voltage rail; and
  an output buffer coupled to a drain of the first FET configured to provide an output voltage;
a local oscillator (LO) configured to generate an LO signal based on the PLL signal; and
a mixer configured to generate a baseband signal, intermediate frequency signal, or radio frequency signal based on the LO signal.

29. An apparatus, comprising:
an input buffer including an input configured to receive an input voltage;
a ramp voltage generator including an input coupled to an output of the input buffer, the ramp voltage generator including a first field effect transistor (FET), a first resistor, and a second FET coupled in series between a first voltage rail and a second voltage rail, a capacitor coupled between a drain of the second FET and the second voltage rail, and a switching device coupled in series with the first resistor, wherein a closed/open state of the switching device is controlled by a control signal;
an evaluation circuit including an input coupled to an output of the ramp voltage generator, wherein the evaluation circuit includes a second resistor coupled in series with a third FET between the first voltage rail and the second voltage rail;
an output buffer including an input coupled to a drain of the third FET and an output configured to generate an output voltage; and
a switch control circuit including an input coupled to the output of at least one of the output buffer or the evaluation circuit, and an output configured to generate the control signal configured to control the closed/open state of the switching device of the ramp voltage generator.

30. An apparatus, comprising:
an input buffer including an input configured to receive an input voltage;
a ramp voltage generator including an input coupled to an output of the input buffer;
an evaluation circuit including an input coupled to an output of the ramp voltage generator, wherein the evaluation circuit includes a first resistor coupled in series with a first field effect transistor (FET) between a first voltage rail and a second voltage rail;
an output buffer including an input coupled to a drain of the first FET and an output configured to generate an output voltage; and
a multiplexer including a first input coupled to the output of the output buffer, a second input coupled to the input of the input buffer, a select input configured to receive a select signal, and an output configured to output the input voltage or the output voltage based on the select signal.

* * * * *